United States Patent [19]

Miller et al.

[11] Patent Number: 4,830,987
[45] Date of Patent: May 16, 1989

[54] CONTACTLESS ANNEALING PROCESS USING COVER SLICES

[75] Inventors: Denise L. Miller; Vance A. Ley, both of Collin, Tex.

[73] Assignee: Texas Instruments Incorporated, Dallas, Tex.

[21] Appl. No.: 122,973

[22] Filed: Nov. 19, 1987

[51] Int. Cl.[4] .......................................... H01L 21/324
[52] U.S. Cl. .................................... 437/247; 437/161; 437/168; 437/169; 437/934; 148/DIG. 3
[58] Field of Search ........................ 148/33, 33.1, 33.2, 148/33.3, 33.4, 33.5, 33.6, DIG. 135, DIG. 24, DIG. 61, DIG. 3, DIG. 4; 437/934, 939, 946, 247, 168, 169, 161, 174

[56] References Cited

U.S. PATENT DOCUMENTS

| | | | |
|---|---|---|---|
| 4,160,682 | 7/1979 | Esseluhn | 437/133 |
| 4,174,247 | 11/1979 | Immonica, Jr. | 437/247 |
| 4,312,681 | 1/1982 | Rupprecht et al. | 437/22 |
| 4,357,180 | 11/1982 | Molnar | 437/247 |
| 4,396,437 | 8/1983 | Kwok et al. | 437/247 |
| 4,544,417 | 10/1985 | Clarke et al. | 148/DIG. 24 |
| 4,742,022 | 5/1988 | Oren et al. | 437/167 |

FOREIGN PATENT DOCUMENTS

| | | | |
|---|---|---|---|
| 0174010 | 3/1986 | European Pat. Off. | 148/DIG. 3 |
| 0048227 | 3/1982 | Japan | 437/168 |
| 0217334 | 12/1984 | Japan | 148/DIG. 3 |
| 0050916 | 3/1985 | Japan | 148/DIG. 3 |
| 0088432 | 5/1985 | Japan | 148/DIG. 3 |

OTHER PUBLICATIONS

Armiento et al., "Capless Rapid Thermal Annealing of Grafts Using Enhanced Overprenune Proximity Technique", *Appl. Phys. Lett.*, 48(23), 9 Jun. 1986, pp. 1623–1625.

Primary Examiner—Brian E. Hearn
Assistant Examiner—T. N. Quach
Attorney, Agent, or Firm—Ferdinand M. Romano; Rene' N. Grossman; Melvin Sharp

[57] ABSTRACT

The disclosure relates to a process for performing processing steps at elevated temperatures on semiconductor devices while minimizing outdiffusion of arsenic therefrom wherein an arsenide containing semiconductor cover wafer is etched to form a flange on the periphery thereof, the cover wafer being placed over the active region of an arsenide containing wafer being processed to form a substantial seal therewith with the active region being spaced from the cover wafer. The wafers are then heated to elevated temperature with outdiffused arsenic being retained in the space between the wafers to raise the arsenic vapor pressure thereat and minimize arsenic outdiffusion thereby. As alternate embodiments, plural wafers being processed and cover wafers can alternately be stacked, one over the other. A further alternate embodiment comprises coating the surface of the cover wafer to avoid contamination of the production wafer with impurities which may exist in the cover wafer.

14 Claims, 1 Drawing Sheet

CONTACTLESS ANNEALING PROCESS USING COVER SLICES

BACKGROUND OF THE INVENTION

1. Field of the Invention

This invention relates to cover slices for use in annealing of gallium arsenide wafers and other group III-V compounds, such as indium phosphide and, more specifically, to the use of a gallium arsenide or other group III-V compound cover for the wafer for entrapping volatilized arsenic therebetween, the material of the cover and the slice preferably being the same.

2. Brief Description of the Prior Art

It is known that, in the production of gallium arsenide FETs, it is normal to utilize a step of ion implantation. When this step is utilized, it is also necessary to utilize an annealing step. During the annealing of gallium arsenide wafers, the annealing temperature of 850 degrees C. is sufficiently high to cause the arsenic in the wafer to volatilize or outdiffuse as the annealing temperature is approached and thereby cause a degradation of the wafer surface due to the loss of arsenic therefrom. In order to avoid or minimize this problem, the prior art has utilized an overcoat over the wafer surface, such as silicon oxide or silicon nitride. This procedure has a number of problems, such as stressing of the wafer, peeling, diffusion of the coating constituents into the wafer as well as the requirement of the extra processing step.

The prior art has also attempted to overcome the above noted problem by the "proximity" method wherein two gallium arsenide wafers are placed face to face. When the opposing surfaces are polished, there is a tendency for these opposing surfaces to undergo liquid phase epitaxy and grow together, thereby ruining the wafers. This problem was overcome by placing a rough surface next to the polished surface. However, with the desire for even better surfaces and with the requirement that annealing take place after a pattern has been formed in the wafer surface, it became essential that the surfaces not make physical contact due to scarring and deposition of particles on the surface. This eliminated the "proximity" method as a viable option.

SUMMARY OF THE INVENTION

In accordance with the present invention, the above noted problems of the prior art are overcome and there is provided apparatus and procedure for providing the benefits of the above described "proximity" method without suffering the debilitating consequences of that method.

Briefly, in accordance with the present invention, a gallium arsenide wafer has a step etched into one surface thereof to produce a flange therearound. This wafer is used as a cover over a wafer being processed so that only the very edge of the cover wafer, at the flange, makes contact with the adjacent wafer, with the active region being adjacent to the etched out step. The depth of the step is from 1 to 1½ mils and preferably 1¼ mils. In this way, the "proximity" effect is still maintained, this being the maintaining of a high arsenic vapor pressure over the surface of the wafer being processed due to the confinement of the vaporized arsenic in the hollow etched out region between the adjacent wafers. This is accomplished with concomitant avoidance of physical contact with the active region of the wafer being processed. Therefore, as the annealing temperature is approached and arsenic is volatilized from both the cover wafer and the wafer being processed, this vaporized arsenic collects in the hollow region between the wafers, with the result being that the arsenic vapor pressure therein quickly builds up to the equilibrium point wherein arsenic is effectively no longer released from the wafer surfaces in the hollowed out region.

It is apparent that the cover will lose arsenic from its surface during its use in the manner above described. It is therefore necessary to periodically test the cover surfaces to insure that sufficient arsenic remains and to discard such covers when the arsenic content falls to undesirable low levels. There is no presently known method of testing cover slices without destroying them. The cover slices are monitored by monitoring the surface quality of slices annealed with the cover slices using a Tencor Surfscan. If a cover slice begins to degrade the surfaces of production slices, it is removed and analyzed. With sufficient data, the life expectancy of such covers can be determined.

It has also been found that contaminants occasionally are found on the cover wafer which travel to the wafer being processed. In order to minimize deleterious effects from such contaminants, a silicon nitride coating can be formed over the cover wafer having a thickness of about 500 Angstroms. The silicon nitride coating is retained during all further processing, i.e., cleanup and anneal.

In actual practice, the wafers are stacked alternately with the bottom wafer being the production wafer followed by a first cover wafer thereover. A further production wafer or wafer being processed is now stacked over the first cover wafer with a second cover wafer thereover. This stacking continues in this manner to an appropriate height as determined by circumstances.

It can be seen that there has been provided a system and procedure for minimizing outdiffusion of arsenic from gallium arsenide wafers during annealing and possibly other high temperature operations thereon without causing undesirable damage to the surface being processed.

DESCRIPTION OF THE PREFERRED EMBODIMENTS

Figure 1:
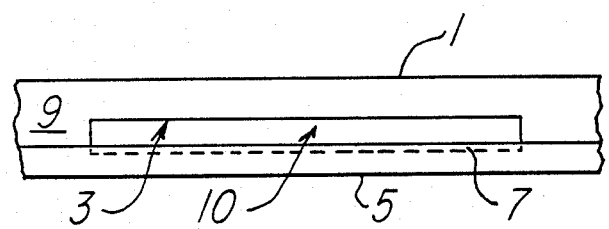
FIG. 1 is a cross-sectional view of a wafer being processed with a cover wafer thereover in accordance with the present invention.

Referring now to FIG. 1, there is shown a gallium arsenide cover wafer 1 having a hollowed out center region 10 of 1 1/4 mils in height. The wafer 1 has a depending flange portion 9 at its edge which contacts a peripheral portion of a gallium arsenide wafer 5 which is being processed and which has an active surface region 7 whereat components are being fabricated. The flange portion 9 rests on the wafer 5 and provides a substantial seal therewith to vapors which form in the hollow region 10 between the wafers 1 and 5.

When an annealing step or other sufficiently high temperature step is to be performed, the cover wafer 1 is placed over the wafer 5 as shown in FIG. 1 and the temperature is gradually raised to the annealing temperature of 850 degrees C. As the final annealing temperature is approached, arsenic from the surfaces of the wafers 1 and 5 will outdiffuse into the hollow region 10 until an equilibrium is reached between outdiffusing arsenic and indiffusing arsenic. This equilibrium is reached when the vapor pressure of arsenic over gallium arsenide in the region 10 is reached. Since the hollow region has a very small volume, only a small amount of arsenic will be lost, this amount being insufficient to degrade the surface of the wafer 5. After annealing, the temperature is reduced and the cover wafer 1 is then removed so that further processing of the wafer 5 can take place.

Figure 2:
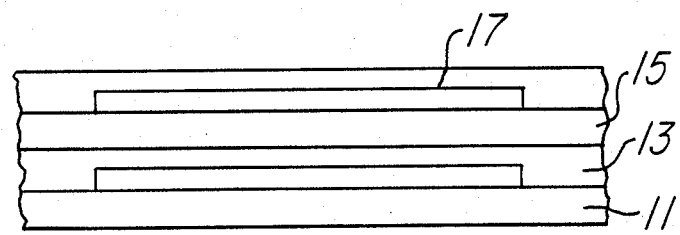
FIG. 2 is a side view of a stack of wafers being processed and cover wafers in accordance with the present invention.

Referring now to FIG. 2, there is shown a second embodiment of the invention wherein wafers being processed 11 and 15 and cover wafers 13 and 17 are alternately stacked for annealling. The wafers 11 and 15 are identical to wafer 5 of FIG. 1 and the wafers 13 and 17 are identical to wafer 1 of FIG. 1. The processing procedures are the same as discussed with reference to FIG. 1 except that greater space efficiency is achieved in the FIG. 2 embodiment.

Cover wafers 1 can be fabricated in accordance with the following procedure. A gallium arsenide wafer is cleaned by standard methods and then coated on one side with a 500 angstrom layer of silicon nitride by plasma deposition. Photoresist 1350J is then applied and exposed using a mask that is clear except for a 0.125 inch thick ring around the periphery of the wafer. The resist is then developed so that the nitride in the center of the wafer can be removed by plasma etching. The center of the wafer was then etched to a depth of about 0.001 inches by immersing the wafer in sodium hypochlorite (NaClO) solution, such as , for example, commercial Clorox, for four hours. During this period the beaker containing the sodium hypochlorite and the wafer is placed in a rotating holder while maintaining the beaker at a forty five degree angle. Following the etch, the wafer is soaked with 600 ml. of 80 degrees C. deionized water for 5 minutes and then flushed with a moderately vigorous stream of deionized water for fifteen minutes. The wafer is then transferred to a beaker containing 200 milliliters of 8:1:1 concentrated sulfuric acid:hydrogen peroxide:water by volume solution to etch for thirty seconds. During the etch, the beaker is placed on a rotating holder while maintaining the beaker at a forty five degree angle. This etch is followed by another fifteen minute deionized water rinse and then the wafers or slices are dried in a stream of filtered nitrogen. After the etch, wash and dry, the silicon nitride is left on to allow future etches without degrading the step which has been formed.

Though the invention has been described with respect to specific preferred embodiments thereof, many variations and variations will immediately become apparent to those skilled in the art. It is therefore the intention that the appended claims be interpreted as broadly as possible in view of the prior art to include all such variations and modifications.

We claim:

1. A method for annealing a compound semiconductor wafer comprising the steps of:
   forming a chamber over a substantially flat region of said wafer with a cover having a flanged portion coming into intimate contact with a peripheral portion of said wafer; and
   heating said cover and said wafer being annealed to a predetermined temperature, the resulting chamber confining volatile constituents of said semiconductor wafer to limit sublimation.

2. The method of claim 1 wherein said cover and said wafer being processed are both formed of a group III arsenide.

3. The method of claim 1 wherein said cover and said wafer being processed are both formed of the same group III arsenide.

4. The method of claim 1 wherein said cover and said wafer being processed are both formed of gallium arsenide.

5. The method of claim 1 wherein said flange and said wafer being processed are in substantially sealing relationship with each other.

6. The method of claim 2 wherein said flange and said wafer being processed are in substantially sealing relationship with each other.

7. The method of claim 3 wherein said flange and said wafer being processed are in substantially sealing relationship with each other.

8. The method of claim 4 wherein said flange and said wafer being processed are in substantially sealing relationship with each other.

9. The method of claim 1 further including the step of forming a silicon nitride coating over said cover, so that when the flanged portion is brought into contact with said wafer, portions of the chamber overlying said wafer are lined with silicon nitride.

10. The method of claim 4 further including the step of forming a silicon nitride coating over said cover, so that when the flanged portion is brought into contact with said wafer, portions of the chamber overlying said wafer are lined with silicon nitride.

11. The method of claim 8 further including the step of forming a silicon nitride coating over said wafer, so that when the flanged portion is brought into contact with said wafer, portions of the chamber overlying said wafer are lined with silicon nitride.

12. The method of claim 1 further including, prior to the heating step, providing a second semiconductor cover having a flange around the perimeter thereof; providing a second semiconductor wafer being processed; placing the second cover and the second wafer being processed in intimate contact with the flange abutting the wafer being processed; and placing the second wafer being processed over and in intimate contact with the first mentioned cover.

13. The method of claim 4 further including, prior to the heating step, providing a second semiconductor cover having a flange around the perimeter thereof; providing a second semiconductor wafer being processed; placing the second cover and the second wafer being processed in intimate contact with the flange abutting the wafer being processed; and placing the second wafer being processed over and in intimate contact with the first mentioned cover.

14. The method of claim 8 further including, prior to the heating step, providing a second semiconductor cover having a flange around the perimeter thereof; providing a second semiconductor wafer being processed; placing the second cover and the second wafer being processed in intimate contact with the flange abutting the wafer being processed; and placing the second wafer being processed over and in intimate contact with the first mentioned cover.

* * * * *